(12) United States Patent
Yang et al.

(10) Patent No.: US 8,661,071 B2
(45) Date of Patent: Feb. 25, 2014

(54) SYSTEMS AND METHODS FOR PARTIALLY CONDITIONED NOISE PREDICTIVE EQUALIZATION

(75) Inventors: Shaohua Yang, San Jose, CA (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 706 days.

(21) Appl. No.: 12/901,742

(22) Filed: Oct. 11, 2010

(65) Prior Publication Data

US 2012/0089657 A1    Apr. 12, 2012

(51) Int. Cl.
*G06F 17/10* (2006.01)

(52) U.S. Cl.
USPC .......................................................... 708/323

(58) Field of Classification Search
USPC ................................................. 708/300–323
See application file for complete search history.

(56) References Cited

U.S. PATENT DOCUMENTS

| | | |
|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |

(Continued)

FOREIGN PATENT DOCUMENTS

| | | |
|---|---|---|
| EP | 0522578 | 1/1993 |
| EP | 1814108 | 8/2007 |

(Continued)

OTHER PUBLICATIONS

U.S. Appl. No. 11/461,026, filed Jul. 31, 2006, Tan, Weijun.

(Continued)

*Primary Examiner* — Tan V. Mai
(74) *Attorney, Agent, or Firm* — Hamilton DeSanctis & Cha

(57) ABSTRACT

Various embodiments of the present invention provide systems and methods for equalization. As an example, a circuit for data equalization is described that includes a 2N state detector circuit that provides a series of detected bits based upon a conditioned input, and a noise predictive filter having a plurality of taps and operable to provide at least a portion of the conditioned input. At least a first of the plurality of taps uses a first subset of the series of detected bits, and a second of the plurality of taps uses a second subset of the series of detected bits. The first subset of the detected bits includes one more bit than the second subset of the detected bits.

30 Claims, 7 Drawing Sheets

(56) References Cited

U.S. PATENT DOCUMENTS

| | | |
|---|---|---|
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,625,775 B1 | 9/2003 | Kim |
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti, II |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,980,382 B2 | 12/2005 | Hirano et al. |
| 6,986,098 B2 | 1/2006 | Poeppelman et al. |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greenberg et al. |
| 7,093,179 B2 | 8/2006 | Shea |
| 7,113,356 B1 | 9/2006 | Wu |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghavan et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghavan et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,523,375 B2 | 4/2009 | Spencer |
| 7,587,657 B2 | 9/2009 | Haratsch |
| 7,590,168 B2 | 9/2009 | Raghavan et al. |
| 7,702,989 B2 | 4/2010 | Graef et al. |
| 7,712,008 B2 | 5/2010 | Song et al. |
| 7,752,523 B1 | 7/2010 | Chaichanavong et al. |
| 7,801,200 B2 | 9/2010 | Tan |
| 7,802,163 B2 | 9/2010 | Tan |
| 2003/0063405 A1 | 4/2003 | Jin et al. |
| 2003/0081693 A1 | 5/2003 | Raghaven et al. |
| 2003/0087634 A1 | 5/2003 | Raghaven et al. |
| 2003/0112896 A1 | 6/2003 | Raghaven et al. |
| 2003/0134607 A1 | 7/2003 | Raghaven et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Vila Casado et al. |
| 2007/0047121 A1 | 3/2007 | Eleftheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2009/0199071 A1 | 8/2009 | Graef |
| 2009/0235116 A1 | 9/2009 | Tan et al. |
| 2009/0235146 A1 | 9/2009 | Tan et al. |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghavan et al. |
| 2010/0050043 A1 | 2/2010 | Savin |
| 2010/0061492 A1 | 3/2010 | Noeldner |
| 2010/0067621 A1* | 3/2010 | Noeldner et al. .............. 375/341 |
| 2010/0067628 A1* | 3/2010 | Buehner et al. ............... 375/346 |
| 2010/0070837 A1 | 3/2010 | Xu et al. |
| 2010/0164764 A1 | 7/2010 | Nayak |
| 2010/0185914 A1 | 7/2010 | Tan et al. |

FOREIGN PATENT DOCUMENTS

| | | |
|---|---|---|
| WO | WO 2006/016751 | 2/2006 |
| WO | WO 2006/134527 | 12/2006 |
| WO | WO 2007/091797 | 8/2007 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2101, Liu, et al.
U.S. Appl. No. 12/887,330, filed Sep. 21, 2010, Zhang, et al.
U.S. Appl. No. 12/887,369, filed Sep. 21, 2010, Liu et al.
U.S. Appl. No. 12/901,816, filed Oct. 11, 2010, Li et al.
U.S. Appl. No. 12/917,756, filed Nov. 2, 2010, Miladinovic et al.
U.S. Appl. No. 12/947,931, filed Nov. 17, 2010, Yang, Shaohua.
U.S. Appl. No. 12/947,947, filed Nov. 17, 2010, Ivkovic et al.
U.S. Appl. No. 12/972,942, filed Dec. 20, 2010, Liao et al.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gunnam, K et al. "Technical Note on Iterative LDPC Solutions for Turbo Equalization", Kiran Gunnam, Gwan Choi and Mark Yeary, Texas A&M Technical Note, Report Date: Jul. 2006.
K. Gunnam et al., "Next Generation iterative LDPC solutions for magnetic recording storage," invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.

(56) References Cited

OTHER PUBLICATIONS

Han and Ryan, "Pinning Techniques for Low-Floor Detection/Decoding of LDPC-Coded Partial Response Channels", 5th International Symposium on Turbo Codes &Related Topics, 2008.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Mohsenin et al., "Split Row: A Reduced Complexity, High Throughput LDPC Decoder Architecture", pp. 1-6, printed from www.ece.ucdavis.edu on Jul. 9, 2007.
Sari H et al., "Transmission Techniques for Digital Terrestrial TV Broadcasting" IEEE Communications Magazine, IEEE Service Center NY, NY vol. 33, No. 2 Feb. 1995.
Unknown, "Auto threshold and Auto Local Threshold" [online] [retrieved May 28, 2010] Retrieved from the Internet: <URL:http://www.dentristy.bham.ac.uk.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Transactions on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

\* cited by examiner

US 8,661,071 B2

SYSTEMS AND METHODS FOR PARTIALLY CONDITIONED NOISE PREDICTIVE EQUALIZATION

BACKGROUND OF THE INVENTION

The present inventions are related to systems and methods for data processing, and more particularly to systems and methods for partially conditioned equalization.

Various circuits have been developed that provide for equalization. In a typical scenario, a three tap equalization circuit is used that includes a three tap noise predictive filtering circuit. The output of the filtering circuit feeds a detector circuit. For high density applications, a longer target typically performs better than a shorter target. In some cases to achieve a longer target, the number of branch metric computation units in the detector circuit is increased, with the increase in branch metric computation units being matched by an increase in a number of noise predictive filters in the predictive filtering circuit. The increased number of noise predictive filters may involve incorporating an additional tap noise compensation circuit. Such an approach can result in underutilization of the additional tap noise compensation circuit.

Hence, for at least the aforementioned reasons, there exists a need in the art for advanced systems and methods for equalization.

BRIEF SUMMARY OF THE INVENTION

The present inventions are related to systems and methods for data processing, and more particularly to systems and methods for partially conditioned equalization.

One or more embodiments of the present invention provide methods for partially conditioned data equalization. Such methods include calculating a fully conditioned noise term; calculating a partially conditioned noise term; and combining the partially conditioned noise term and the fully conditioned noise term to yield a whitened noise output. In some cases, the method further includes using the whitened noise output to generate a noise whitening filter coefficient. The noise whitening filter coefficient is a noise term multiplier or a a coefficient for a finite impulse response filter. In various cases, generating the noise whitened filter coefficient is done based on minimizing a least mean squared value.

Other embodiments of the present invention may provide noise term calculation circuits that include a fully conditioned noise term calculation circuit operable to receive an input and to calculate a fully conditioned noise term; a partially conditioned noise term calculation circuit operable to receive the input and to calculate a partially conditioned noise term; and a processor circuit operable to receive the partially conditioned noise term and the fully conditioned noise term and to generate a noise whitening filter coefficient. In some cases, generating the noise whitened filter coefficient is done based on minimizing a least mean squared value.

Various embodiments of the present invention provide data equalization circuits that includes a $2^N$ state detector circuit that provides a series of detected bits based upon a conditioned input, and a noise predictive filter having a plurality of taps and operable to provide at least a portion of the conditioned input. At least a first of the plurality of taps uses a first subset of the series of detected bits, and a second of the plurality of taps uses a second subset of the series of detected bits.

In one or more instances of the aforementioned embodiments, the circuit further includes a noise predictive filtering circuit. In such instances, the noise predictive filter is one of a plurality of noise predictive filters included in the noise predictive filtering circuit. In particular cases, each of the plurality of noise predictive filters provides an output corresponding to a respective state transition of the $2^N$ state detector circuit. In one case, the number of the plurality of noise predictive filters is equal to $2^{N+1}$.

In other cases, N is equal to four, and the number of the plurality of noise predictive filters is thirty-two. In such cases, an output of a first of the plurality of noise predictive filters corresponds to a transition from a zero state to the zero state of the detector circuit; an output of a second of the plurality of noise predictive filters corresponds to a transition from the zero state to a one state of the detector circuit; an output of a third of the plurality of noise predictive filters corresponds to a transition from the one state to a two state of the detector circuit; an output of a fourth of the plurality of noise predictive filters corresponds to a transition from the one state to a three state of the detector circuit; an output of a fifth of the plurality of noise predictive filters corresponds to a transition from the two state to a four state of the detector circuit; an output of a sixth of the plurality of noise predictive filters corresponds to a transition from the two state to a five state of the detector circuit; an output of a seventh of the plurality of noise predictive filters corresponds to a transition from the three state to a six state of the detector circuit; an output of an eighth of the plurality of noise predictive filters corresponds to a transition from the three state to a seven state of the detector circuit; an output of a ninth of the plurality of noise predictive filters corresponds to a transition from the four state to an eight state of the detector circuit; an output of a tenth of the plurality of noise predictive filters corresponds to a transition from the four state to a nine state of the detector circuit; an output of an eleventh of the plurality of noise predictive filters corresponds to a transition from the five state to a ten state of the detector circuit; an output of a twelfth of the plurality of noise predictive filters corresponds to a transition from the five state to an eleven state of the detector circuit; an output of a thirteenth of the plurality of noise predictive filters corresponds to a transition from the six state to a twelve state of the detector circuit; an output of a fourteenth of the plurality of noise predictive filters corresponds to a transition from the six state to a thirteen state of the detector circuit; an output of a fifteenth of the plurality of noise predictive filters corresponds to a transition from the seven state to a fourteen state of the detector circuit; an output of a sixteenth of the plurality of noise predictive filters corresponds to a transition from the seven state to a fifteen state of the detector circuit; an output of a seventeenth of the plurality of noise predictive filters corresponds to a transition from the eight state to the zero state of the detector circuit; an output of a eighteenth of the plurality of noise predictive filters corresponds to a transition from the eight state to the one state of the detector circuit; an output of an nineteenth of the plurality of noise predictive filters corresponds to a transition from the nine state to the two state of the detector circuit; an output of a twentieth of the plurality of noise predictive filters corresponds to a transition from the nine state to the three state of the detector circuit; an output of a twenty-first of the plurality of noise predictive filters corresponds to a transition from the ten state to the four state of the detector circuit; an output of a twenty-second of the plurality of noise predictive filters corresponds to a transition from the ten state to the five state of the detector circuit; an output of a twenty-third of the plurality of noise predictive filters corresponds to a transition from the eleven state to the six state of the detector circuit; an output of a twenty-fourth of the plurality of noise predictive filters corresponds to a transition from the eleven state to the seven state of the detector circuit; an output of a twenty-fifth of the plurality of noise predictive filters corresponds to a transition from the twelve state to the eight state of the detector circuit; an output of a twenty-sixth of the plurality of noise predictive filters corresponds to a transition from the twelve state to the nine state of the detector circuit; an output of a twenty-seventh of the plurality of noise predictive filters corresponds to a transition from the thirteen state to the ten state of the detector circuit; an output of a twenty-eighth of the plurality of noise predictive filters corresponds to a transition from the thirteen state to the eleven state of the detector circuit; an output of a twenty-ninth of the plurality of noise predictive filters corresponds to a transition from the fourteen state to the twelve state of the detector circuit; an output of a thirtieth of the plurality of noise predictive filters corresponds to a transition from the fourteen state to the thirteen state of the detector circuit; an output of a thirty-first of the plurality of noise predictive filters corresponds to a transition from the fifteen state to the fourteen state of the detector circuit; and an output of a thirty-second of the plurality of noise predictive filters corresponds to a transition from the fifteen state to the fifteen state of the detector circuit.

In other cases, the circuit further includes an equalizing circuit operable to equalize a data input to a three value ($g_2$, $g_1$, $g_0$) target and to provide an equalized output. In some such cases, N is equal to four and the number of the plurality of taps of each of the plurality of noise predictive filters (L) is equal to four. In particular cases, a first of the plurality of taps uses the first subset of the series of detected bits ($a_{-2}$, $a_{-1}$, $a_0$) to calculate an ideal signal value in accordance with the following equation:

$$\hat{y}_0 = a_{-2}g_2 + a_{-1}g_1 + a_0 g_0,$$

where $a_0$ is the most recent bit provided as an output of the $2^N$ state detector circuit, $a_{-1}$ is the second most recent bit provided as an output of the $2^N$ state detector circuit, and $a_{-2}$ is the third most recent bit provided as an output of the $2^N$ state detector circuit; a second of the plurality of taps uses the second subset of detected bits ($a_{-4}$, $a_{-3}$) to calculate an ideal signal value in accordance with the following equation:

$$\hat{y}_{-3} = a_{-4}g_1 + a_{-3}g_0,$$

where $a_{-3}$ is the fourth most recent bit provided as an output of the $2^N$ state detector circuit, and $a_{-4}$ is the fifth most recent bit provided as an output of the $2^N$ state detector circuit; a third of the plurality of taps uses a third subset of the series of detected bits ($a_{-3}$, $a_{-2}$, $a_{-1}$) to calculate an ideal signal value in accordance with the following equation:

$$\hat{y}_{-1} = a_{-3}g_2 + a_{-2}g_1 + a_{-1}g_0;$$

and a fourth of the plurality of taps uses a fourth subset of the series of detected bits ($a_{-4}$, $a_{-3}$, $a_{-2}$) to calculate an ideal signal value in accordance with the following equation:

$$\hat{y}_{-2} = a_{-4}g_2 + a_{-3}g_1 + a_{-2}g_0.$$

Other embodiments of the present invention provide methods for calibrating a partially conditioned equalization circuit. Such methods include providing an equalizing circuit operable to equalize a data input to a three value ($g_2$, $g_1$, $g_0$) target and to provide an equalized output; providing a series of detected bits ($a_{-4}$, $a_{-3}$, $a_{-2}$, $a_{-1}$, $a_0$); calculating a first noise component ($NC_1$) in accordance with the following equation:

$$NC_1 = \hat{Y}_0 - (a_{-2}g_2 + a_{-1}g_1 + a_0 g_0);$$

calculating a second noise component ($NC_2$) in accordance with the following equation:

$$NC_2 = \hat{Y}_{-1} - (a_{-3}g_2 + a_{-2}g_1 + a_{-1}g_0);$$

calculating a third noise component ($NC_3$) in accordance with the following equation:

$$NC_3 = \hat{Y}_{-2} - (a_{-4}g_2 + a_{-3}g_1 + a_{-2}g_0); \text{ and}$$

calculating a fourth noise component ($NC_4$) in accordance with the following equation:

$$NC_4 = \hat{Y}_{-3} - (a_{-4}g_1 + a_{-3}g_0).$$

In some instances of the aforementioned embodiments, the methods further include determining values of a set of noise term multipliers ($f_{-2}$, $f_{-1}$, $f_0$) that yields a minimum value of the following equation:

$$[NC_1 f_0 + NC_2 f_{-1} + NC_3 f_{-2}]^2.$$

In one or more instances of the aforementioned embodiments, the methods further include using the set of noise term multipliers to determine value of a partially conditioned noise term multiplier ($f_{-3}$) that yields a minimum value of the following equation:

$$[NC_1 f_0 + NC_2 f_{-1} + NC_3 f_{-2} + NC_4 f_{-3}]^2.$$

The set of noise term multipliers and the partially conditioned noise term multiplier may be stored.

Yet other embodiments of the present invention provide methods for partially conditioned data equalization that include: providing a plurality of noise predictive filters that each include X taps and is capable of calculating noise whitened outputs based upon an equalizer target; receiving a data input; performing a data equalization on the data input to yield an equalized output; and providing the equalized output to each of the plurality of predictive filters. Each of the plurality of predictive filters provide a respective noise whitened output using all of the X taps, and one of the X taps uses less than the full equalizer target and the other of the X taps uses the full equalizer target.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for partially conditioned equalization.

Various embodiments of the present invention provide systems, circuits and methods that provide for enhanced performance equalization using an M-tap target with an L tap noise predictive filtering. Such enhanced performance may be exhibited in an increase in signal to noise ratio. In one particular embodiment of the present invention, equalization to a three tap target is done using a four tap noise predictive filter. Such utilization may be done without increasing the number of states in a noise predictive maximum likelihood detector circuit. In one particular instance, the noise term used for a least mean squared error estimation associated with the last tap in the L tap noise predictive filter is not dependent on the third bit of the M-tap target. Thus, the noise term associated with the last tap in the L tap noise predictive filter has a mixed Gaussian distribution, but is treated as if it exhibited a Gaussian distribution. In some cases, the mixed Gaussian distribution is mixed over 2 mean values depending upon the polarity of the Lth bit. Thus, where a three tap target is used, the Gaussian distribution is mixed over two mean values depending upon the polarity of the remaining dropped bit.

In some cases, two different noise sequences are generated. The first noise sequence is based on a full condition and the second is based on a partial sequence. These noise sequences are used for whitening filter adaptation. For example, where it is assumed that there is a $2^N$ state trellis detector circuit making decisions based on outputs from an L tap whitening filter (i.e., filter taps $f_0$, $f_{-1}$, $f_{-2}$ and $f_{(-L+1)}$). The L tap whitening filter filters an equalized output from an M tap target (i.e., having a target polynomial $g_0$, $g_1$, $g_2$). Where, for example, N is four, M is three, then in the non-partial condition the range of values for L is:

$$L <= (N+1) - M + 1, \text{ or}$$

$$L <= 3.$$

In contrast, for the partial condition ($Y_{-3} = \hat{Y}' - (a_{-4}g_1 + a_{-3}g_0)$), L is equal to four instead of the $L<=3$ for the non-partial condition. The aforementioned values (i.e., N=4, M=3 and L=4) are possible where one bit ($a_{-5}$) is dropped from the condition. It should be noted that the situation may be generalized to allow for situations where more than one bit is dropped. In such a situation, noise may be calculated based upon one less bit, and based upon two less bits.

Figure 1A:
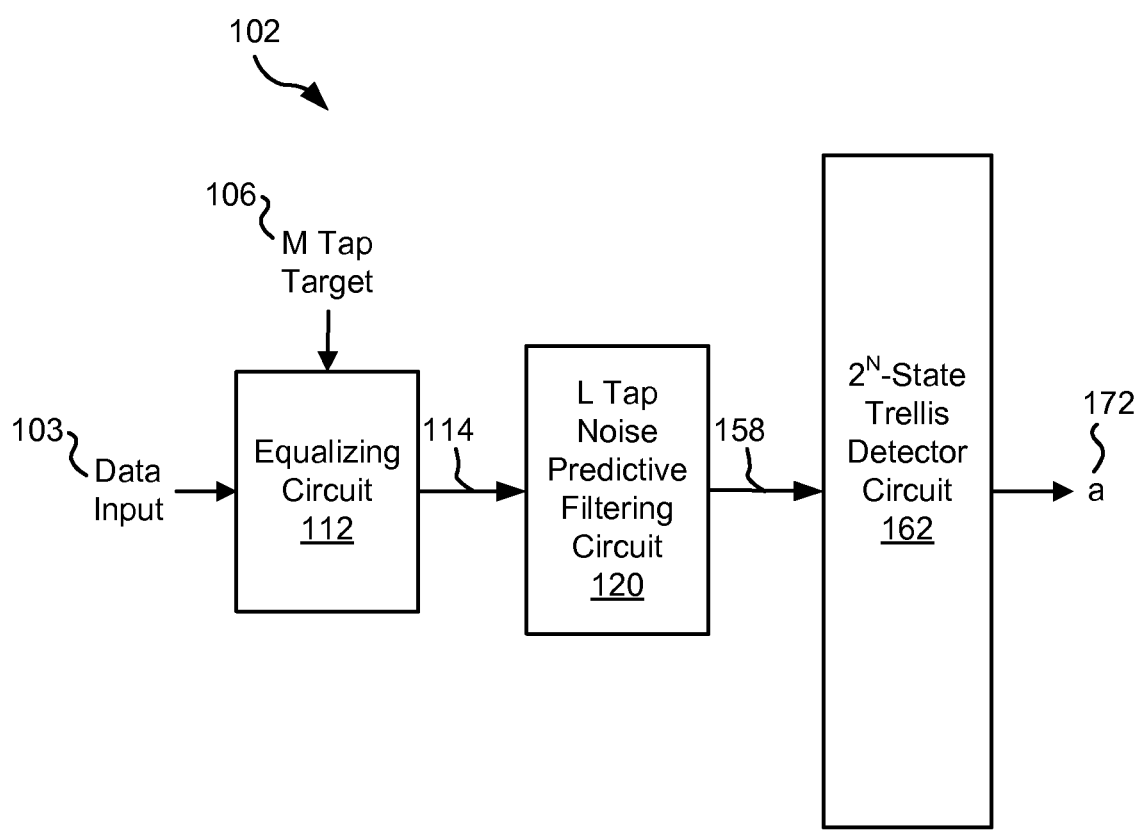
FIG. 1a depicts an M tap target with L tap noise predictive filtering circuit in accordance with one or more embodiments of the present invention.

Turning to FIG. 1a, an M tap target with an L tap noise predictive filtering circuit 102 is shown in accordance with one or more embodiments of the present invention. Circuit 102 includes an equalizing circuit 112 that receives a data input 103. Equalizing circuit 112 provides an equalized output 114 that is equalized to an M tap target 106 where M is the number of taps in the target. Equalizing circuit 112 may be any circuit known in the art that is capable of receiving a data input and equalizing the data input to a target. Equalized output 114 may be denoted Y, and includes both an equalized representation of a data input ($\hat{Y}$) and a noise component as described in the following equation:

$$Y = \hat{Y} + \text{Noise}.$$

$\hat{Y}$ is a signal constellation without noise and is a function of the target polynomial (i.e., M tap target 106) and the non-return to zero bits.

Figure 2:
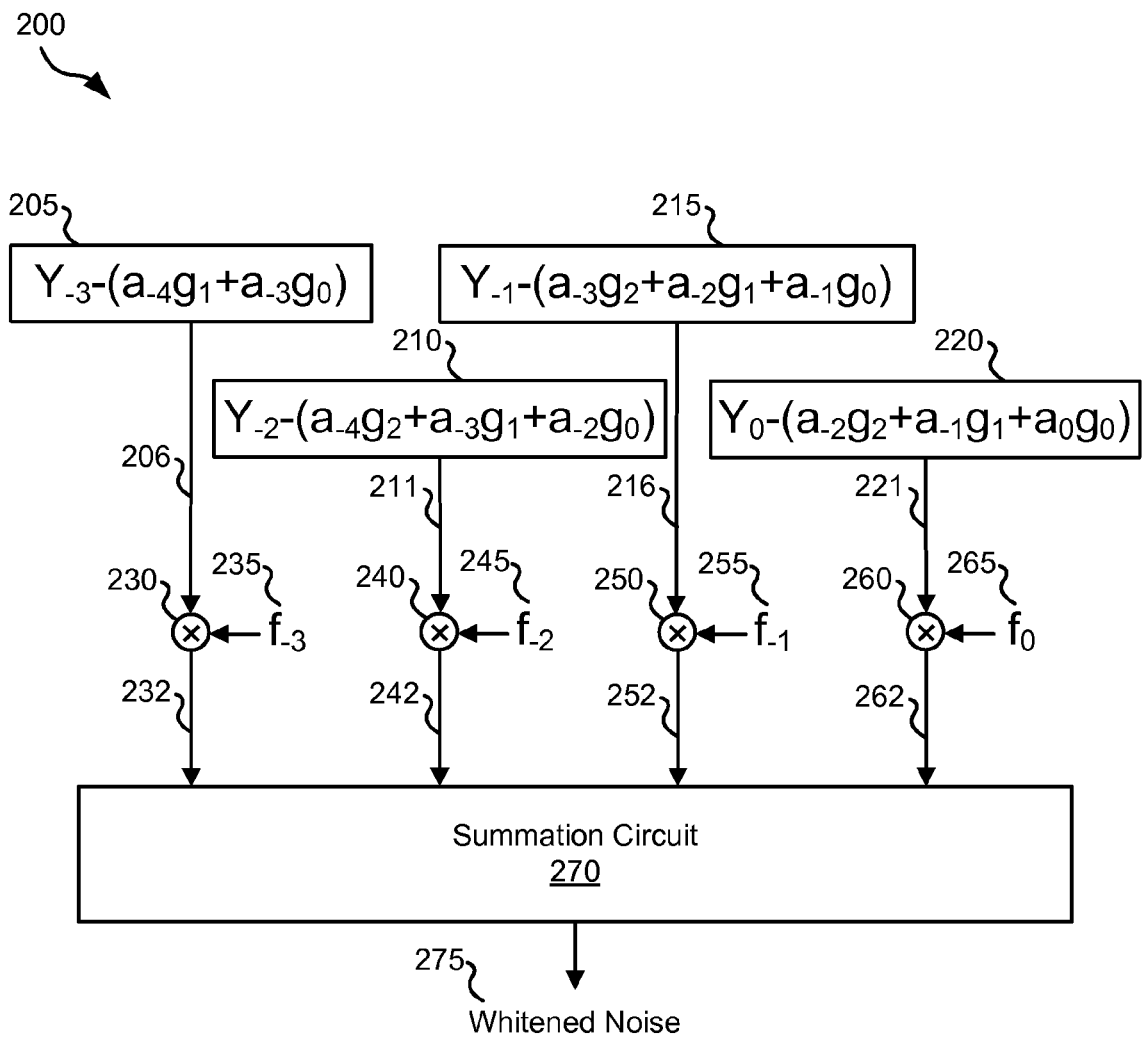
FIG. 2 shows an L tap noise predictive filter in accordance with various embodiments of the present invention.

Equalized output 114 is provided to an L tap noise predictive filtering circuit 120 includes $2^{N+1}$ noise predictive filters each operable to yield a noise predictive output that are use to govern branch choices in a $2^N$ state trellis detector circuit. L tap noise predictive filtering circuit 120 includes more noise predictive filters than can be fully utilized by the output from equalizing circuit 112. The extra noise predictive filters are used as shown in FIG. 2 below to increase the performance of circuit 102. Such an increase in performance may be expressed as an increase in signal to noise ratio.

The noise predictive outputs are collectively depicted as a noise predictive output 158 that is provided to a trellis detector circuit 162. Trellis detector circuit 162 may be any maximum likelihood detector circuit known in the art. In some embodiments, trellis detector circuit 162 includes $2^N$ states with $2^{N+1}$ branch computation units. Each of the $2^{N+1}$ branch computation units computes a respective branch metric indicating a transition from a prior one of the $2^N$ states to a subsequent one of the $2^N$ states. Trellis detector circuit 162 provides a most likely next state (a) 172.

Figure 1B:
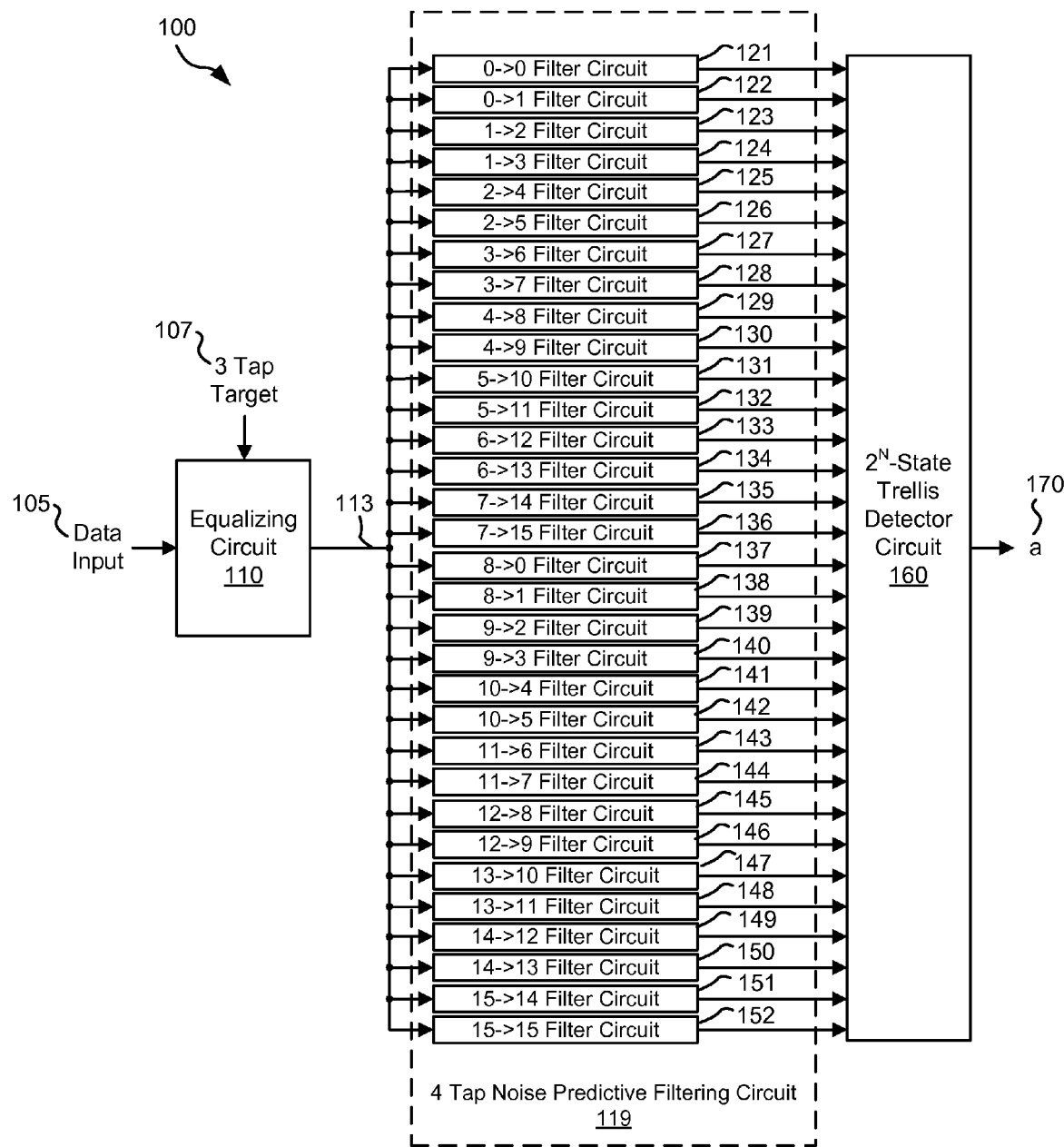
FIG. 1b depicts a three tap target with four tap noise predictive filtering circuit in accordance with one or more embodiments of the present invention.

Turning to FIG. 1b, a three tap target with four tap noise predictive filtering circuit 100 is depicted in accordance with one or more embodiments of the present invention. Circuit 100 includes an equalizing circuit 110 that receives a data input 105. Equalizing circuit 110 provides an equalized output 113 that is equalized to a three tap target 107. Equalizing circuit 110 may be any circuit known in the art that is capable of receiving a data input and equalizing the data input to a target. Equalized output 113 may be denoted Y, and includes both an equalized representation of a data input ($\hat{Y}$) and a noise component as described in the following equation:

$$Y = \hat{Y} + \text{Noise}.$$

$\hat{Y}$ is a signal constellation without noise and is a function of the target polynomial (i.e., three tap target 107) and the non-return to zero bits.

Equalized output 113 is provided to a four tap noise predictive filtering circuit 119 (outlined by a dashed line) that includes thirty-two noise predictive filters each operable to yield a respective noise predictive output. In particular, four tap noise predictive filtering circuit 119 includes a noise predictive filter 121 calculating a noise predictive output corresponding to a transition from the zero state to the zero state; a noise predictive filter 122 calculating a noise predictive output corresponding to a transition from the zero state to the one state; a noise predictive filter 123 calculating a noise predictive output corresponding to a transition from the one state to the two state; a noise predictive filter 124 calculating a noise predictive output corresponding to a transition from the one state to the three state; a noise predictive filter 125 calculating a noise predictive output corresponding to a transition from the two state to the four state; a noise predictive filter 126 calculating a noise predictive output corresponding to a transition from the two state to the five state; a noise predictive filter 127 calculating a noise predictive output corresponding to a transition from the three state to the six state; a noise predictive filter 128 calculating a noise predictive output corresponding to a transition from the three state to the seven state; a noise predictive filter 129 calculating a noise predictive output corresponding to a transition from the four state to the eight state; a noise predictive filter 130 calculating a noise predictive output corresponding to a transition from the four state to the nine state; a noise predictive filter 131 calculating a noise predictive output corresponding to a transition from the five state to the ten state; a noise predictive filter 132 calculating a noise predictive output corresponding to a transition from the five state to the eleven state; a noise predictive filter 133 calculating a noise predictive output corresponding to a transition from the six state to the twelve state; a noise predictive filter 134 calculating a noise predictive output corresponding to a transition from the six state to the thirteen state; a noise predictive filter 135 calculating a noise predictive output corresponding to a transition from the seven state to the fourteen state; a noise predictive filter 136 calculating a noise predictive output corresponding to a transition from the seven state to the fifteen state; a noise predictive filter 137 calculating a noise predictive output corresponding to a transition from the eight state to the zero state; a noise predictive filter 138 calculating a noise predictive output corresponding to a transition from the eight state to the one state; a noise predictive filter 139 calculating a noise predictive output corresponding to a transition from the none state to the two state; a noise predictive filter 140 calculating a noise predictive output corresponding to a transition from the nine state to the three state; a noise predictive filter 141 calculating a noise predictive output corresponding to a transition from the ten state to the four state; a noise predictive filter 142 calculating a noise predictive output corresponding to a transition from the ten state to the five state; a noise predictive filter 143 calculating a noise predictive output corresponding to a transition from the eleven state to the six state; a noise predictive filter 144 calculating a noise predictive output corresponding to a transition from the eleven state to the seven state; a noise predictive filter 145 calculating a noise predictive output corresponding to a transition from the twelve state to the eight state; a noise predictive filter 146 calculating a noise predictive output corresponding to a transition from the twelve state to the nine state; a noise predictive filter 147 calculating a noise predictive output corresponding to a transition from the thirteen state to the ten state; a noise predictive filter 148 calculating a noise predictive output corresponding to a transition from the thirteen state to the eleven state; a noise predictive filter 149 calculating a noise predictive output corresponding to a transition from the fourteen state to the twelve state; a noise predictive filter 150 calculating a noise predictive output corresponding to a transition from the fourteen state to the thirteen state; a noise predictive filter 151 calculating a noise predictive output corresponding to a transition from the fifteen state to the fourteen state; and a noise predictive filter 152 calculating a noise predictive output corresponding to a transition from the fifteen state to the fifteen state.

Four tap noise predictive filtering circuit 119 includes more noise predictive filter taps than can be fully utilized by the output from equalizing circuit 112. The extra noise predictive filter tap is used as shown in FIG. 2 below to increase the performance of circuit 100. Such an increase in performance may be expressed as an increase in signal to noise ratio.

The noise predictive outputs from the respective noise predictive filters are provided to an N-state trellis detector circuit 160. Trellis detector circuit 160 may be any maximum likelihood detector circuit known in the art. Trellis detector circuit 160 includes sixteen states with thirty-two branch computation units. Each of the thirty-two branch computation units computes a respective branch metric indicating a transition from a prior one of the sixteen states to a subsequent one of the sixteen states. Trellis detector circuit 160 provides a most likely next state (a) 170.

Turning to FIG. 2, an L tap noise predictive filter circuit 200 is shown in accordance with various embodiments of the present invention. Circuit 200 may be used in place of each of the noise predictive filter circuits of FIG. 1a and FIG. 1b. Circuit 200 includes a series of noise predictive finite impulse response tap calculator circuits 205, 210, 215, 220.

Three of the noise predictive finite impulse response tap calculator circuits 210, 215, 220 implement a standard noise term calculators calculating noise terms for preceding periods. In particular, noise predictive finite impulse response tap calculator circuit 220 calculates the most recent noise term 221 in accordance with the following equation:

$$Y_0 = \text{Noise Term } 221 = \hat{Y}_0 - (a_{-2}g_2 + a_{-1}g_1 + a_0g_0),$$

where $g_2$, $g_1$, $g_0$ are the target values provided to an upstream equalizing circuit (e.g., M tap target 106 provided to equalizing circuit 112); $a_0$ is the most recent bit provided as an output of a detector circuit (e.g., detector circuit 162); $a_{-1}$ is the second most recent bit provided as an output of a detector circuit (e.g., detector circuit 162); $a_{-2}$ is the third most recent bit provided as an output of a detector circuit (e.g., detector circuit 162); and $\hat{Y}_0$ is the most recent equalized sample provided by the upstream equalizing circuit (e.g., equalized output 114 provided from equalizing circuit 112). Noise predictive finite impulse response tap calculator circuit 215 calculates the second most recent noise term 216 in accordance with the following equation:

$$\text{Noise Term } 216 = \hat{Y}_{-1} - (a_{-3}g_2 + a_{-2}g_1 + a_{-1}g_0),$$

where $g_2$, $g_1$, $g_0$ are the target values provided to an upstream equalizing circuit (e.g., M tap target 106 provided to equalizing circuit 112); $a_{-1}$ is the second most recent bit provided as an output of a detector circuit (e.g., detector circuit 162); $a_{-2}$ is the third most recent bit provided as an output of a detector circuit (e.g., detector circuit 162); $a_{-3}$ is the fourth most recent bit provided as an output of a detector circuit (e.g., detector circuit 162); and $\hat{Y}_{-1}$ is the second most recent equalized sample provided by the upstream equalizing circuit (e.g., equalized output 114 provided from equalizing circuit 112). Noise predictive finite impulse response tap calculator circuit 210 calculates the third most recent noise term 211 in accordance with the following equation:

$$\text{Noise Term } 211 = \hat{Y}_{-2} - (a_{-4}g_2 + a_{-3}g_1 + a_{-2}g_0),$$

where $g_2$, $g_1$, $g_0$ are the target values provided to an upstream equalizing circuit (e.g., M tap target 106 provided to equalizing circuit 112); $a_{-2}$ is the third most recent bit provided as an output of a detector circuit (e.g., detector circuit 162); $a_{-3}$ is the fourth most recent bit provided as an output of a detector circuit (e.g., detector circuit 162); $a_{-4}$ is the fifth most recent bit provided as an output of a detector circuit (e.g., detector circuit 162); and $\hat{Y}_{-2}$ is the third most recent equalized sample provided by the upstream equalizing circuit (e.g., equalized output 114 provided from equalizing circuit 112).

The other noise predictive finite impulse response tap calculator circuit 205 corresponds to an extra filter tap that cannot be fully used due to the lack of available bits (a). In particular, in this case L tap noise predictive filter circuit 200 is a four tap noise predictive filter circuit supporting a trellis detector circuit with thirty-two branch metric calculator circuits. The thirty-two branch metric calculator circuits maintain a total of five bits ($\log_2 32$) that are denoted $a_{-4}$, $a_{-3}$, $a_{-2}$, $a_{-1}$, $a_0$. In order to fully use the extra filter tap, a sixth bit ($a_{-5}$) is needed to perform the following calculation:

$$\text{Standard Calculation} = \hat{Y}_{-3} - (a_{-5}g_2 + a_{-4}g_1 + a_{-3}g_0).$$

As the sixth bit is not available, noise predictive finite impulse response tap calculator circuit 205 implements a modified noise term calculation that ignores the $g_2$ term as shown in the following equation:

$$\text{Noise Term } 206 = \hat{Y}' - (a_{-4}g_1 + a_{-3}g_0),$$

where $g_1$, $g_0$ are a subset of the target values provided to an upstream equalizing circuit (e.g., M tap target 106 provided to equalizing circuit 112); $a_{-4}$ is the fifth most recent bit provided as an output of a detector circuit (e.g., detector circuit 162); $a_{-3}$ is the fourth most recent bit provided as an output of a detector circuit (e.g., detector circuit 162); and $\hat{Y}_{-3}$ is the third most recent equalized sample provided by the upstream equalizing circuit (e.g., equalized output 114 provided from equalizing circuit 112).

Noise term 206 is provided to a multiplier circuit 230 where it is multiplied by a noise term multiplier ($f_{-3}$) 235 to yield an interim product 232. Noise term 211 is provided to a multiplier circuit 240 where it is multiplied by a noise term multiplier ($f_{-2}$) 245 to yield an interim product 242. Noise term 216 is provided to a multiplier circuit 250 where it is multiplied by a noise term multiplier ($f_{-1}$) 255 to yield an interim product 252. Noise term 221 is provided to a multiplier circuit 260 where it is multiplied by a noise term multiplier ($f_0$) 265 to yield an interim product 262. Interim products 232, 242, 252, 262 are all provided to a summation circuit 270 where they are added together to yield a whitened noise output 275 in accordance with the following equation:

Whitened Noise 275 = Interim Product 232 +
  Interim Product 242 + Interim Product 252 + Interim Product 262

The aforementioned equation is equivalent to the following equation:

Whitened Noise 275 =
$f_{-3}[Y_{-3} - (a_{-4}g_1 + a_{-3}g_0)] + f_{-2}[Y_{-2} - (a_{-4}g_2 + a_{-3}g_1 + a_{-2}g_0)] +$
$f_{-1}[Y_{-1} - (a_{-3}g_2 + a_{-2}g_1 + a_{-1}g_0)] + f_0[Y_0 - (a_{-2}g_2 + a_{-1}g_1 + a_0g_0)]$ Noise term multipliers $f_{-3}$, $f_{-2}$, $f_{-1}$, $f_0$ are noise predictive finite impulse response filter taps calculated during a calibration process that is described below in relation to FIG. 3.

Figure 3:
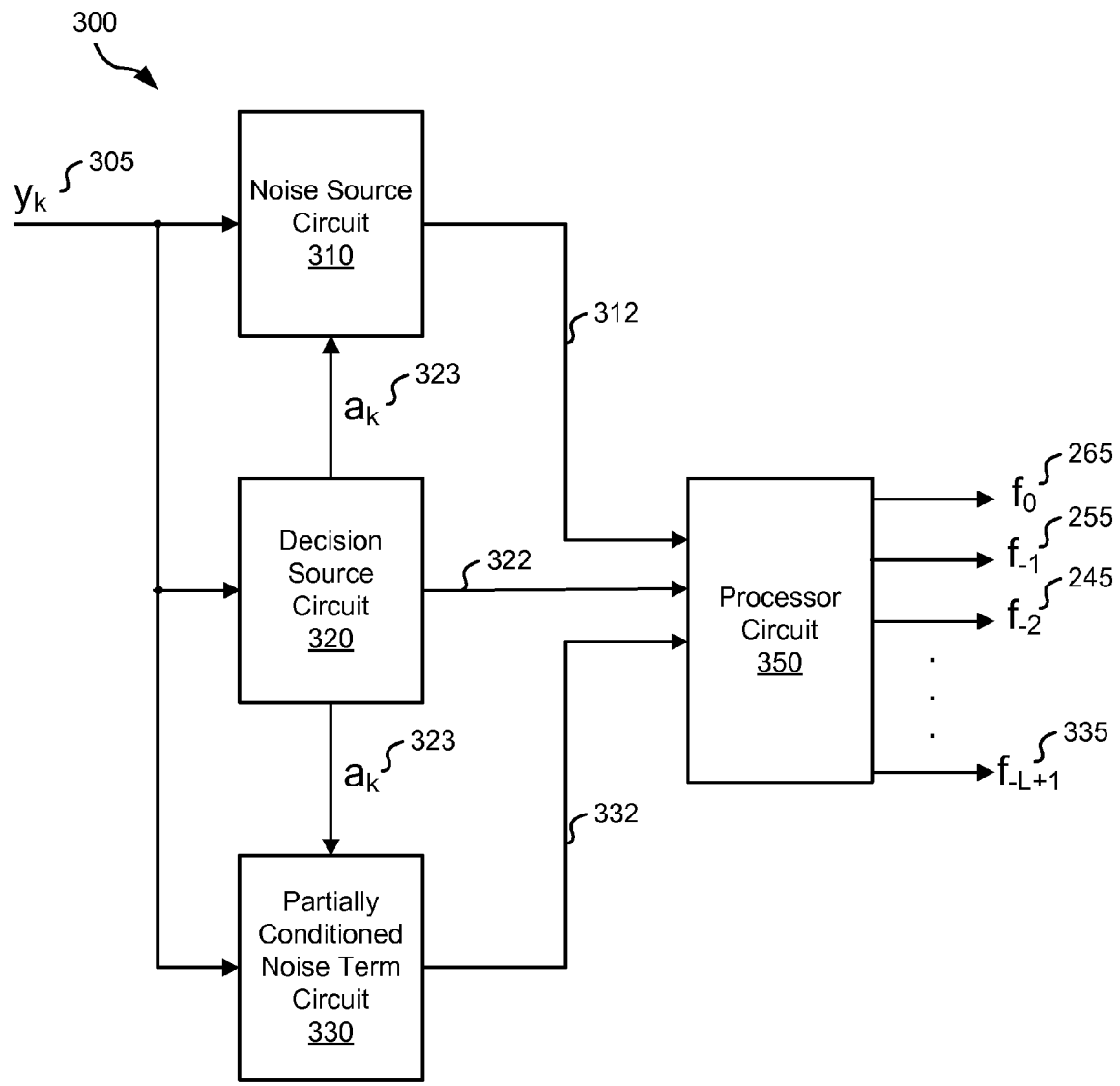
FIG. 3 depicts a calibration circuit operable to calculate noise term multipliers for use in relation to an L tap noise predictive filter in accordance with some embodiments of the present invention.

Turning to FIG. 3, a calibration circuit 300 operable to calculate noise term multipliers (e.g., noise predictive finite impulse response filter taps) for use in relation to an L tap noise predictive filter is shown in accordance with some embodiments of the present invention. Calibration circuit 300 includes a noise source circuit 310 that provides the noise component ($Y_k - \hat{Y}_k$) for a given input ($Y_k$) 305. Input 305 is a known calibration value that is provided to a decision source circuit 320 that makes a decision on what the value of the corresponding detected bit ($a_k$) 323 should be. Thus for time t=0, a noise component $Y_0 - \hat{Y}_0$ is calculated by noise source circuit 310 based upon a known input value and detected bits in accordance with the following equation:

$$Y_0 - \hat{Y}_0 = Y_0 - (a_{-2}g_2 + a_{-1}g_1 + a_0g_0),$$

where $g_2$, $g_1$, $g_0$ are the target values provided to an upstream equalizing circuit (e.g., M tap target 106 provided to equalizing circuit 112); $a_0$ is the most recent bit provided as an output ($a_k$) of decision source circuit 320; $a_{-1}$ is the second most recent bit provided as an output ($a_k$) of decision source circuit 320; and $a_{-2}$ is the third most recent bit provided as an output ($a_k$) of decision source circuit 320. For time t=−1 (i.e., a preceding bit period), a noise component $Y_{-1} - \hat{Y}_{-1}$ is calculated by noise source circuit 310 based upon a known input value and detected bits in accordance with the following equation:

$$Y_{-1} - \hat{Y}_{-1} = Y_{-1} - (a_{-3}g_2 + a_{-2}g_1 + a_{-1}g_0),$$

where $g_2$, $g_1$, $g_0$ are the target values provided to an upstream equalizing circuit (e.g., M tap target 106 provided to equalizing circuit 112); $a_{-1}$ is the second most recent bit provided as an output ($a_k$) of decision source circuit 320; $a_{-2}$ is the third most recent bit provided as an output ($a_k$) of decision source circuit 320; and $a_{-3}$ is the third most recent bit provided as an output ($a_k$) of decision source circuit 320. For time t=−2 (i.e., two preceding bit periods earlier), a noise component $Y_{-2} - \hat{Y}_{-2}$ is calculated by noise source circuit 310 based upon a known input value and detected bits in accordance with the following equation:

$$Y_{-2} - \hat{Y}_{-2} = Y_{-2} - (a_{-4}g_2 + a_{-3}g_1 + a_{-2}g_0),$$

where $g_2$, $g_1$, $g_0$ are the target values provided to an upstream equalizing circuit (e.g., M tap target 106 provided to equalizing circuit 112); $a_{-2}$ is the third most recent bit provided as an output ($a_k$) of decision source circuit 320; $a_{-3}$ is the third most recent bit provided as an output ($a_k$) of decision source circuit 320; and $a_{-4}$ is the fourth most recent bit provided as an output ($a_k$) of decision source circuit 320. The aforementioned noise components ($Y_k - \hat{Y}_k$) are provided as an output 312 to a processor circuit 350.

Partially conditioned noise term circuit 330 receives a known input ($Y_k$) 305 and a detected bit ($a_k$) 323 and uses the inputs to calculate a partially conditioned noise term $Y_{-3} - \hat{Y}'$ in accordance with the following equation:

$$Y_{-3} - \hat{Y}' = Y_{-3} - (a_{-4}g_1 + a_{-3}g_0)$$

The partially conditioned noise term is provided as an output 332 to processor circuit 350. Of note, the partially conditioned noise term is calculated as if the fifth most recent bit ($a_{-5}$) is not known when in a calibration phase it is actually known. This is done to be consistent with the dropping of the $g_2$ term as discussed above during normal operation.

Processor circuit 350 uses a least mean squared algorithm to calculate the values of noise term multipliers 335, 245, 255, 265 ($f_{(-L+1)}$, $f_{-2}$, $f_{-1}$, $f_0$). Such noise term multipliers may be used as noise predictive finite impulse response filter taps. In particular, processor circuit 350 operates to calculate values for noise term multipliers 245, 255, 265 that yield a minimum value for the following equation:

$$\text{Value} = [(Y_0 - \hat{Y}_0)f_0 + (Y_{-1} - \hat{Y}_{-1})f_{-1} + (Y_{-2} - \hat{Y}_{-2})f_{-2}]^2.$$

In addition, processor circuit 350 operates to calculate a value for noise term multiplier 335 that accounts for the partially conditioned noise term $Y_{-3} - \hat{Y}'$ provides as output 332 from partially conditioned noise term circuit 330. In particular, processor circuit 350 uses the values of noise term multipliers 245, 255, 265 calculated by minimizing the output value of the preceding equation and calculates the value of noise term multiplier 335 that minimizes the value of the following equation:

$$\text{Value}=[(Y_0-\hat{Y}_0)f_0+(Y_{-1}-\hat{Y}_{-1})f_{-1}+(Y_{-2}-\hat{Y}_{-2})f_{-2}+(Y_{-3}-\hat{Y}')f_{-3}]^2.$$

The calculated noise term values ($f_{-3}$, $f_{-2}$, $f_{-1}$, $f_0$) are provided to each of the noise predictive filters included in L tap noise predictive filtering circuit 120 or four tap noise predictive filtering circuit 119 described above in relation to FIG. 1a and FIG. 1b. The calculated noise terms ($f_{-3}$, $f_{-2}$, $f_{-1}$, $f_0$) can be optimized by minimizing Value from the equation above.

Figure 4:
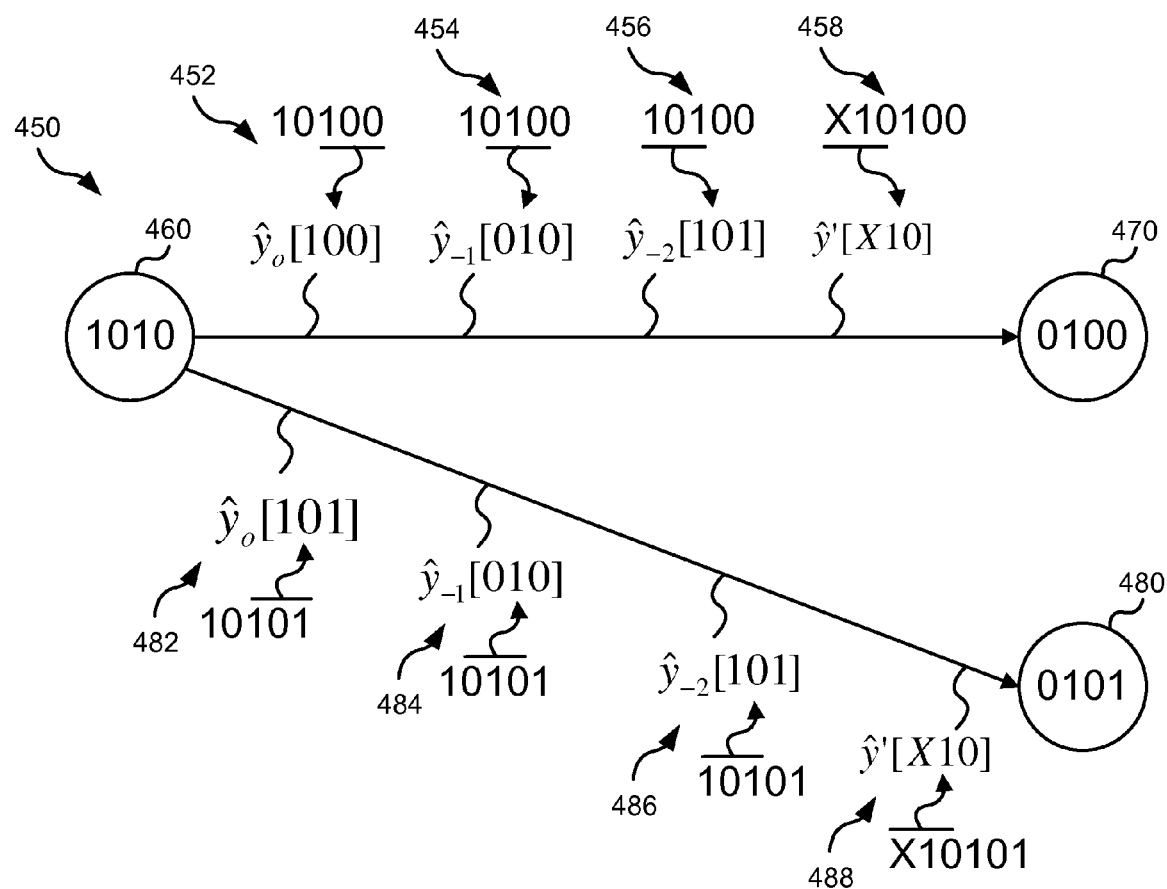
FIG. 4 shows a portion of a trellis diagram in relation to noise terms calculated by the noise predictive filtering circuits of FIGS. 1a-1b above.

Turning to FIG. 4, a portion of a sixteen state trellis diagram 450 is shown to describe the operation of the trellis detector circuits 160, 162 discussed above in relation to FIGS. 1a-1b. Of note, trellis detector circuit 162 may have more or fewer than sixteen states, and the depicted states (i.e., state 1010, state 0100 and state 0101) are merely used for description purposes and that other states may be used. As shown, trellis diagram 450 depicts a transition from a ten state ('1010') 460 to either a four state ('0100') 470 or a five state ('0101') based upon respective outputs from either N+1 tap noise predictive filtering circuit 120 or four tap noise predictive filtering circuit 119 that correspond to transitions from a ten state to a four state (i.e., values 452, 454, 456, 458) and transitions from a ten state to a five state (i.e., values 482, 484, 486, 488). As is known in the art, the transition exhibiting the lowest values is selected as the maximum likelihood next state. Of note, value 452 uses the $a_{-2}$, $a_{-1}$ and $a_0$ bits; value 454 uses the $a_{-3}$, $a_{-2}$ and $a_{-1}$ bits; value 456 uses the $a_{-4}$, $a_{-3}$ and $a_{-2}$ bits; and value 458 uses only the $a_{-4}$ and $a_{-3}$ bits by ignoring the $g_2$ term as described above. Similarly, value 482 uses the $a_{-2}$, $a_{-1}$ and $a_0$ bits; value 484 uses the $a_{-3}$, $a_{-2}$ and $a_{-1}$ bits; value 486 uses the $a_{-4}$, $a_{-3}$ and $a_{-2}$ bits; and value 488 uses only the $a_{-4}$ and $a_{-3}$ bits by ignoring the $g_2$ term as described above.

Figure 5:
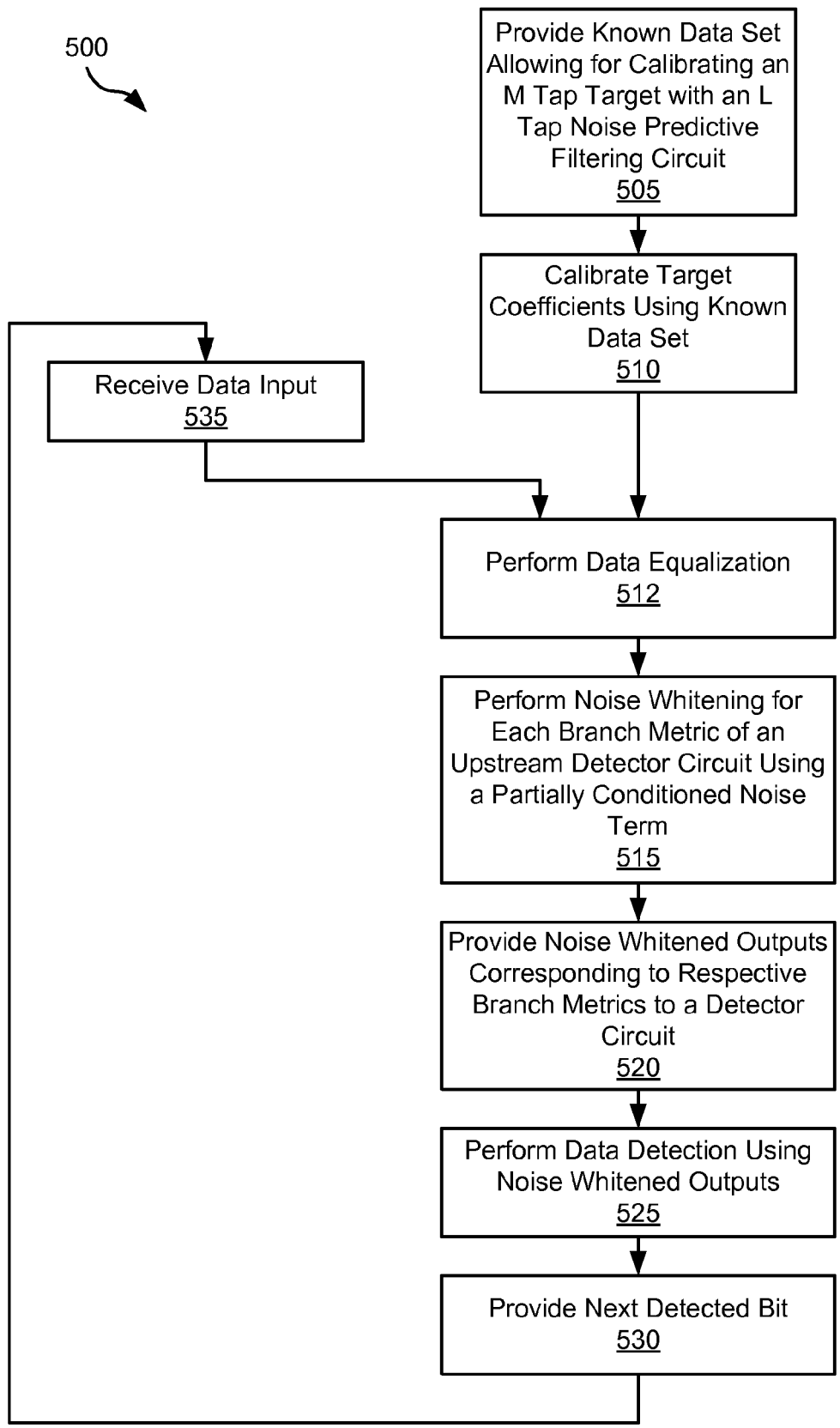
FIG. 5 is a flow diagram showing equalization using an M tap target with an L tap noise predictive filtering circuit in accordance with one or more embodiments of the present invention.

Turning to FIG. 5, a flow diagram 500 shows a method of equalization using an M tap target with an L tap noise predictive filtering circuit in accordance with one or more embodiments of the present invention. Following flow diagram 500, a known data set is provided for use in calibrating an M tap target with an L tap noise predictive filtering circuit (block 505). This known data set is used to calibrate noise term values for use during operation (block 510). In particular, a noise component for time t=0 ($Y_0-\hat{Y}_0$) is calculated in accordance with the following equation:

$$Y_0-\hat{Y}_0=Y_0-(a_{-2}g_2+a_{-1}g_1+a_0g_0),$$

where $g_2$, $g_1$, $g_0$ are the target values provided to an upstream equalizing circuit (e.g., M tap target 106 provided to equalizing circuit 112); $a_0$ is the most recent bit provided as an output ($a_k$) of a decision source; $a_{-1}$ is the second most recent bit provided as an output ($a_k$) of a decision source; and $a_{-2}$ is the third most recent bit provided as an output ($a_k$) of a decision source. In addition, a noise component for time t=1 ($Y_{-1}-\hat{Y}_{-1}$) is calculated in accordance with the following equation:

$$Y_{-1}-\hat{Y}_{-1}=Y_{-1}-(a_{-3}g_2+a_{-2}g_1+a_{-1}g_0),$$

where $g_2$, $g_1$, $g_0$ are the target values provided to an upstream equalizing circuit (e.g., M tap target 106 provided to equalizing circuit 112); $a_{-1}$ is the second most recent bit provided as an output ($a_k$) of a decision source; $a_{-2}$ is the third most recent bit provided as an output ($a_k$) of a decision source; and $a_{-3}$ is the third most recent bit provided as an output ($a_k$) of a decision source. Further, a noise component for time t=2 ($Y_{-2}-\hat{Y}_{-2}$) is calculated in accordance with the following equation:

$$Y_{-2}-\hat{Y}_{-2}=Y_{-2}-(a_{-4}g_2+a_{-3}g_1+a_{-2}g_0),$$

where $g_2$, $g_1$, $g_0$ are the target values provided to an upstream equalizing circuit (e.g., M tap target 106 provided to equalizing circuit 112); $a_{-2}$ is the third most recent bit provided as an output ($a_k$) of a decision source; $a_{-3}$ is the third most recent bit provided as an output ($a_k$) of a decision source; and $a_{-4}$ is the fourth most recent bit provided as an output ($a_k$) of a decision source. Yet further, a partially conditioned noise term $Y_{-3}-\hat{Y}'$ is calculated in accordance with the following equation:

$$Y_{-3}-\hat{Y}'=Y_{-3}-(a_{-4}g_1+a_{-3}g_0),$$

where $g_1$ and $g_0$ are a subset of the target values provided to an upstream equalizing circuit (e.g., M tap target 106 provided to equalizing circuit 112); $a_{-3}$ is the third most recent bit provided as an output ($a_k$) of a decision source; and $a_{-4}$ is the fourth most recent bit provided as an output ($a_k$) of a decision source.

The noise terms corresponding to times t=0, t=1 and t=2 are used together in a least mean squared equation to determine calibrated values for noise term multipliers ($f_{-3}$, $f_{-2}$, $f_{-1}$, $f_0$). Such noise term multipliers may be used as noise predictive finite impulse response filter taps. In particular, the values for all but one of the aforementioned noise term multipliers (i.e., $f_{-2}$, $f_{-1}$, $f_0$) are calculates such that they yield a minimum value for the following equation:

$$\text{Value}=[(Y_0-\hat{Y}_0)f_0+(Y_{-1}-\hat{Y}_{-1})f_{-1}+(Y_{-2}-\hat{Y}_2)f_{-2}]^2.$$

The values determined for the aforementioned noise term multipliers (i.e., $f_{-2}$, $f_{-1}$, $f_0$) are then used along with the aforementioned partially conditioned noise term to determine a noise term multiplier ($f_{-3}$) that minimizes the value of the following equation:

$$\text{Value}=[(Y_0-\hat{Y}_0)f_0+(Y_{-1}-\hat{Y}_{-1})f_{-1}+(Y_{-2}-\hat{Y}_{-2})f_{-2}+(Y_{-3}-\hat{Y}')f_{-3}]^2.$$

The calculated noise term values ($f_{-3}$, $f_{-2}$, $f_{-1}$, $f_0$) are the result of the calibration and are used during operation of the circuit.

A data input is received (block 535). The data input may be derived from any data source known in the art including, but not limited to, a hard disk drive or a wireless receiving device. Based upon the disclosure provided herein, one of ordinary skill in the art will recognize a variety of sources of the data input. The data input is equalized using target values to yield an equalized output $Y_t$ (block 512). A noise whitening is performed on the equalized output by a number of noise predictive filters to yield respective noise whitened outputs corresponding to branch metrics in a downstream detector circuit (block 515). As an example, where a sixteen state detector circuit is to be fed, thirty-two noise predictive filters are used to calculate noise whitened outputs corresponding to the thirty-two branch metrics in the sixteen state detector circuit. In such a case, the noise whitened output corresponds to the following equation:

$$\begin{aligned}\text{Whitened Noise 275} = \\ f_{-3}[Y_{-3}-(a_{-4}g_1+a_{-3}g_0)]+f_{-2}[Y_{-2}-(a_{-4}g_2+a_{-3}g_1+a_{-2}g_0)]+\\ f_{-1}[Y_{-1}-(a_{-3}g_2+a_{-2}g_1+a_{-1}g_0)]+f_0[Y_0-(a_{-2}g_2+a_{-1}g_1+a_0g_0)]\end{aligned}$$

where noise term multipliers ($f_{-3}$, $f_{-2}$, $f_{-1}$, $f_0$) were provided by the calibration process of block 510; $g_2$, $g_1$, $g_0$ are the target values used by the equalization process of block 512; $a_0$ is the most recent bit provided as an output of the detection process of block 525; $a_{-1}$ is the second most recent bit provided as an output of the detection process of block 525; $a_{-2}$ is the third most recent bit provided as an output of the detection process of block 525; $a_{-3}$ is the fourth most recent bit provided as an output of the detection process of block 525; $a_{-4}$ is the fifth most recent bit provided as an output of the detection process of block 525; $\hat{Y}_0$ is the most recent equalized sample provided by the equalization process of block 512; $\hat{Y}_{-1}$ is the second most recent equalized sample provided by the equalization process of block 512; and $\hat{Y}_{-2}$ is the third most recent equalized sample provided by the equalization process of block 512.

The noise whitened outputs are provided to the detector circuit (block 520) that performs a maximum likelihood detection process weighted by the noise whitened outputs (block 525). This detection process yields the next detected bit ($a_0$) (block 530). And the previously detected bits are shifted (i.e., $a_0 \rightarrow a_{-1}$; $a_{-1} \rightarrow a_{-2}$ etc. . . . ). The process of blocks 512-535 is then repeated for the next received data bit.

Figure 6:
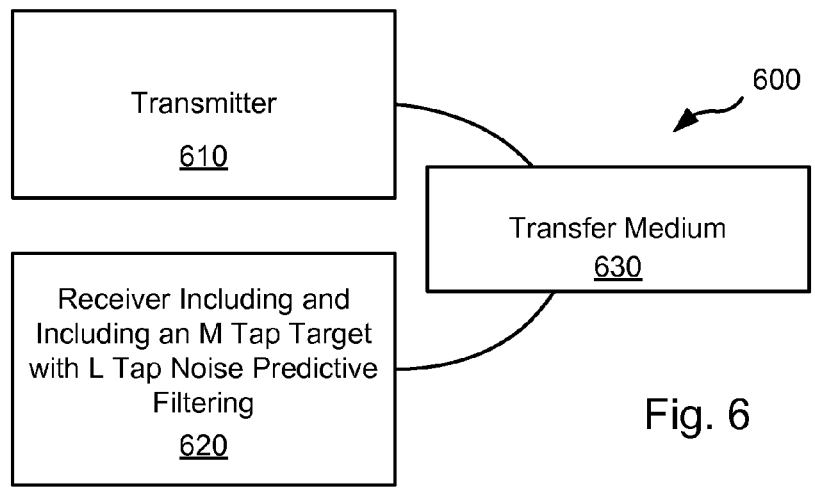
FIG. 6 depicts a communication system including a receiver having an M tap target with an L tap noise predictive filtering in accordance with different embodiments of the present invention.

Turning to FIG. 6, a communication system 600 including a receiver 620 having an M tap target with an L tap noise predictive filtering circuit is shown in accordance with different embodiments of the present invention. Communication system 600 includes a transmitter 610 that is operable to transmit encoded information via a transfer medium 630 as is known in the art. The encoded data is received from transfer medium 630 by receiver 620. Receiver 620 incorporates an M tap target with an L tap noise predictive filtering circuit. The M tap target with an L tap noise predictive filtering circuit may be similar to that discussed above in relation to FIGS. 1-3, and/or may operate in accordance with the method discussed above in relation to FIG. 5. Based on the disclosure provided herein, one of ordinary skill in the art will recognize a variety of mediums for which equalization and targeting in accordance with embodiments of the present invention may be done.

Figure 7:
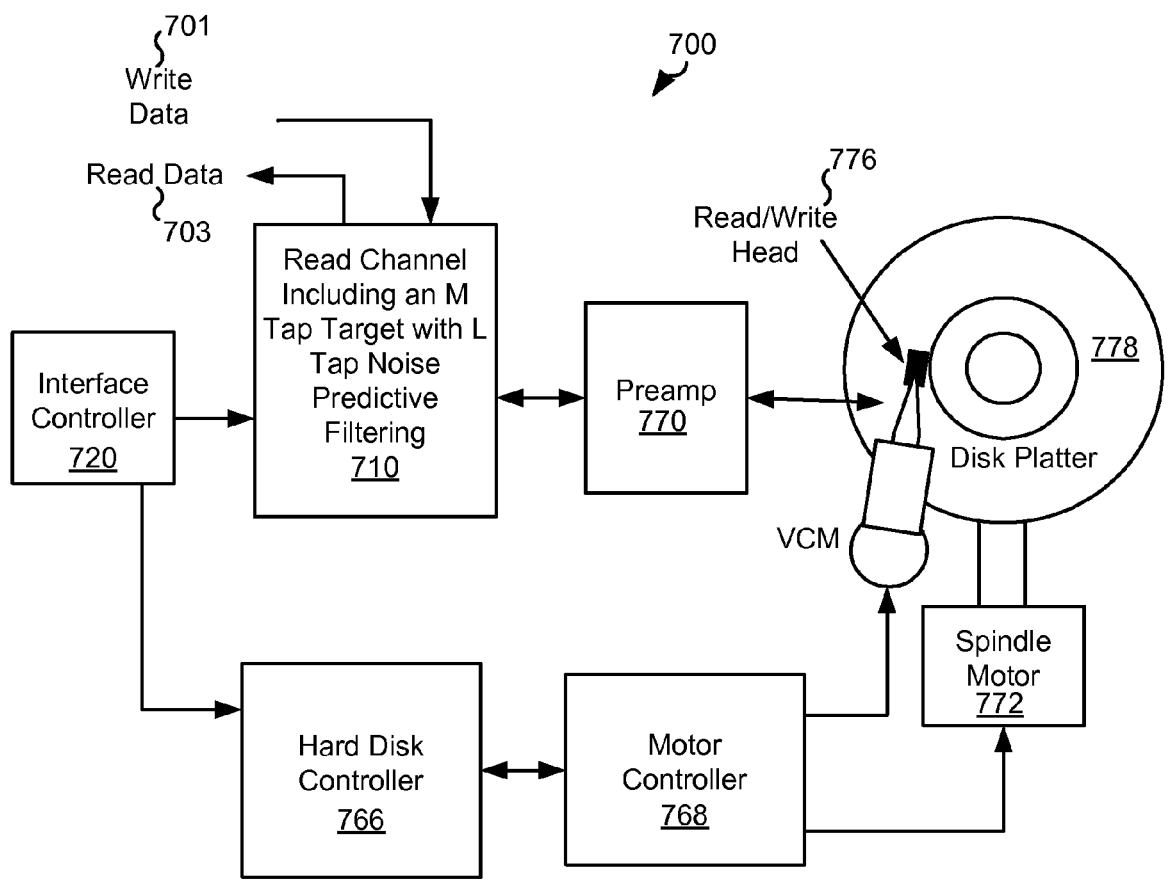
FIG. 7 shows a storage system including a read channel circuit with an M tap target with an L tap noise predictive filtering in accordance with some embodiments of the present invention.

Turning to FIG. 7, a storage system 700 including a read channel circuit 710 an M tap target with an L tap noise predictive filtering circuit is shown in accordance with various embodiments of the present invention. Storage system 700 may be, for example, a hard disk drive. Storage system 700 also includes a preamplifier 770, an interface controller 720, a hard disk controller 766, a motor controller 768, a spindle motor 772, a disk platter 778, and a read/write head 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with either a longitudinal or a perpendicular recording scheme.

In a typical read operation, read/write head assembly 776 is accurately positioned by motor controller 768 over a desired data track on disk platter 778. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel circuit 710 via preamplifier 770. Preamplifier 770 is operable to amplify the minute analog signals accessed from disk platter 778. In turn, read channel circuit 710 decodes and digitizes the received analog signal to recreate the information originally written to disk platter 778. This data is provided as read data 703 to a receiving circuit. As part of decoding the received information, read channel circuit 710 performs an equalization process. The circuit for performing the equalization process may be similar to that discussed above in relation to FIGS. 1-3, and/or may operate in accordance with the method discussed above in relation to FIG. 5. A write operation is substantially the opposite of the preceding read operation with write data 701 being provided to read channel circuit 710. This data is then encoded and written to disk platter 778.

It should be noted that storage system 700 may be integrated into a larger storage system such as, for example, a RAID (redundant array of inexpensive disks or redundant array of independent disks) based storage system. It should also be noted that various functions or blocks of storage system 700 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data equalization circuit, the circuit comprising:
   an N state detector circuit, wherein the N state detector circuit provides a series of detected bits based upon a conditioned input; and
   a noise predictive filter having a plurality of taps and operable to provide at least a portion of the conditioned input, wherein at least a first of the plurality of taps uses a first subset of the series of detected bits, wherein a second of the plurality of taps uses a second subset of the series of detected bits, and wherein the first subset of the detected bits includes one more bit than the second subset of the detected bits.

2. The circuit of claim 1, wherein the circuit is implemented in an integrated circuit.

3. The circuit of claim 1, wherein the number of the plurality of taps is equal to N.

4. The circuit of claim 1, wherein the circuit further comprises:

a noise predictive filtering circuit, wherein the noise predictive filter is one of a plurality of noise predictive filters included in the noise predictive filtering circuit.

5. The circuit of claim 4, wherein each of the plurality of noise predictive filters provides an output corresponding to a respective state transition of the N state detector circuit.

6. The circuit of claim 4, wherein the number of the plurality of noise predictive filters is equal to $2^{N+1}$.

7. The circuit of claim 4, wherein N is equal to four, and wherein the number of the plurality of noise predictive filters is thirty-two, wherein an output of a first of the plurality of noise predictive filters corresponds to a transition from a zero state to the zero state of the detector circuit; wherein an output of a second of the plurality of noise predictive filters corresponds to a transition from the zero state to a one state of the detector circuit; wherein an output of a third of the plurality of noise predictive filters corresponds to a transition from the one state to a two state of the detector circuit; wherein an output of a fourth of the plurality of noise predictive filters corresponds to a transition from the one state to a three state of the detector circuit; wherein an output of a fifth of the plurality of noise predictive filters corresponds to a transition from the two state to a four state of the detector circuit; wherein an output of a sixth of the plurality of noise predictive filters corresponds to a transition from the two state to a five state of the detector circuit; wherein an output of a seventh of the plurality of noise predictive filters corresponds to a transition from the three state to a six state of the detector circuit; wherein an output of an eighth of the plurality of noise predictive filters corresponds to a transition from the three state to a seven state of the detector circuit; wherein an output of a ninth of the plurality of noise predictive filters corresponds to a transition from the four state to an eight state of the detector circuit; wherein an output of a tenth of the plurality of noise predictive filters corresponds to a transition from the four state to a nine state of the detector circuit; wherein an output of an eleventh of the plurality of noise predictive filters corresponds to a transition from the five state to a ten state of the detector circuit; wherein an output of a twelfth of the plurality of noise predictive filters corresponds to a transition from the five state to an eleven state of the detector circuit; wherein an output of a thirteenth of the plurality of noise predictive filters corresponds to a transition from the six state to a twelve state of the detector circuit; wherein an output of a fourteenth of the plurality of noise predictive filters corresponds to a transition from the six state to a thirteen state of the detector circuit; herein an output of a fifteenth of the plurality of noise predictive filters corresponds to a transition from the seven state to a fourteen state of the detector circuit; wherein an output of a sixteenth of the plurality of noise predictive filters corresponds to a transition from the seven state to a fifteen state of the detector circuit; wherein an output of a seventeenth of the plurality of noise predictive filters corresponds to a transition from the eight state to the zero state of the detector circuit; wherein an output of a eighteenth of the plurality of noise predictive filters corresponds to a transition from the eight state to the one state of the detector circuit; wherein an output of an nineteenth of the plurality of noise predictive filters corresponds to a transition from the nine state to the two state of the detector circuit; wherein an output of a twentieth of the plurality of noise predictive filters corresponds to a transition from the nine state to the three state of the detector circuit; wherein an output of a twenty-first of the plurality of noise predictive filters corresponds to a transition from the ten state to the four state of the detector circuit; wherein an output of a twenty-second of the plurality of noise predictive filters corresponds to a transition from the ten state to the five state of the detector circuit; wherein an output of a twenty-third of the plurality of noise predictive filters corresponds to a transition from the eleven state to the six state of the detector circuit; wherein an output of a twenty-fourth of the plurality of noise predictive filters corresponds to a transition from the eleven state to the seven state of the detector circuit; wherein an output of a twenty-fifth of the plurality of noise predictive filters corresponds to a transition from the twelve state to the eight state of the detector circuit; wherein an output of a twenty-sixth of the plurality of noise predictive filters corresponds to a transition from the twelve state to the nine state of the detector circuit; wherein an output of a twenty-seventh of the plurality of noise predictive filters corresponds to a transition from the thirteen state to the ten state of the detector circuit; wherein an output of a twenty-eighth of the plurality of noise predictive filters corresponds to a transition from the thirteen state to the eleven state of the detector circuit; wherein an output of a twenty-ninth of the plurality of noise predictive filters corresponds to a transition from the fourteen state to the twelve state of the detector circuit; wherein an output of a thirtieth of the plurality of noise predictive filters corresponds to a transition from the fourteen state to the thirteen state of the detector circuit; wherein an output of a thirty-first of the plurality of noise predictive filters corresponds to a transition from the fifteen state to the fourteen state of the detector circuit; and wherein an output of a thirty-second of the plurality of noise predictive filters corresponds to a transition from the fifteen state to the fifteen state of the detector circuit.

8. The circuit of claim 4, wherein the circuit further comprises:
an equalizing circuit operable to equalize a data input to a three value ($g_2$, $g_1$, $g_0$) target and to provide an equalized output.

9. The circuit of claim 8, wherein N is equal to four, wherein the number of the plurality of taps of each of the plurality of noise predictive filters is equal to four.

10. The circuit of claim 9, wherein a first of the plurality of taps uses the first subset of the series of detected bits ($a_{-2}$, $a_{-1}$, $a_0$) to calculate a noise value in accordance with the following equation:

$$a_{-2}g_2 + a_{-1}g_1 + a_0g_0,$$

where $a_0$ is the most recent bit provided as an output of the N state detector circuit, $a_{-1}$ is the second most recent bit provided as an output of the N state detector circuit, and $a_{-2}$ is the third most recent bit provided as an output of the N state detector circuit;

wherein a second of the plurality of taps uses the second subset of detected bits ($a_{-4}$, $a_{-3}$) to calculate a noise value in accordance with the following equation:

$$a_{-4}g_1 + a_{-3}g_0,$$

where $a_{-3}$ is the fourth most recent bit provided as an output of the N state detector circuit, and $a_{-4}$ is the fifth most recent bit provided as an output of the N state detector circuit;

wherein a third of the plurality of taps uses a third subset of the series of detected bits ($a_{-3}$, $a_{-2}$, $a_{-1}$) to calculate a noise value in accordance with the following equation:

$$a_{-3}g_2 + a_{-2}g_1 + a_{-1}g_0; \text{ and}$$

wherein a fourth of the plurality of taps uses a fourth subset of the series of detected bits ($a_{-4}$, $a_{-3}$, $a_{-2}$) to calculate a noise value in accordance with the following equation:

$$a_{-4}g_2 + a_{-3}g_1 + a_{-2}g_0.$$

11. The circuit of claim 4, wherein each of the plurality of noise predictive
filters is a noise predictive finite impulse response filter.

12. The circuit of claim 1, wherein the circuit is implemented as part of a device selected from a group consisting of: a storage device and a communication device.

13. The circuit of claim 1, wherein the circuit is implemented as part of an electronic device, wherein the electronic device is selected from a group consisting of: a hard disk drive and a wireless transmission device.

14. The circuit of claim 13, wherein the electronic device is the hard disk drive, and wherein the hard disk drive includes:
a storage medium;
a read/write head assembly disposed in relation to the storage medium; and
a read channel device operable to processing information received from the read/write head assembly and including the N state detector circuit and the noise predictive filter.

15. The circuit of claim 13, wherein the electronic device is the wireless transmission device, and wherein the wireless transmission device includes:
a receiver including the N state detector circuit and the noise predictive filter.

16. The circuit of claim 15, wherein the transmission device further comprises:
a transmitter.

17. A system for data equalization, the system comprising:
data equalization circuit including:
an N state detector circuit, wherein the N state detector circuit provides a series of detected bits based upon a conditioned input; and
a noise predictive filter having a plurality of taps and operable to provide at least a portion of the conditioned input, wherein at least a first of the plurality of taps uses a first subset of the series of detected bits, wherein a second of the plurality of taps uses a second subset of the series of detected bits, and wherein the first subset of the detected bits includes one more bit than the second subset of the detected bits.

18. The system of claim 17, wherein the system is implemented as part of a data processing circuit.

19. The system of claim 17, wherein the system is implemented as part of an integrated circuit.

20. The system of claim 17, wherein the number of the plurality of taps is equal to N.

21. The circuit of claim 20, wherein N is equal to four, and wherein the number of the plurality of noise predictive filters is thirty-two, wherein an output of a first of the plurality of noise predictive filters corresponds to a transition from a zero state to the zero state of the detector circuit; wherein an output of a second of the plurality of noise predictive filters corresponds to a transition from the zero state to a one state of the detector circuit; wherein an output of a third of the plurality of noise predictive filters corresponds to a transition from the one state to a two state of the detector circuit; wherein an output of a fourth of the plurality of noise predictive filters corresponds to a transition from the one state to a three state of the detector circuit; wherein an output of a fifth of the plurality of noise predictive filters corresponds to a transition from the two state to a four state of the detector circuit; wherein an output of a sixth of the plurality of noise predictive filters corresponds to a transition from the two state to a five state of the detector circuit; wherein an output of a seventh of the plurality of noise predictive filters corresponds to a transition from the three state to a six state of the detector circuit; wherein an output of an eighth of the plurality of noise predictive filters corresponds to a transition from the three state to a seven state of the detector circuit; wherein an output of a ninth of the plurality of noise predictive filters corresponds to a transition from the four state to an eight state of the detector circuit; wherein an output of a tenth of the plurality of noise predictive filters corresponds to a transition from the four state to a nine state of the detector circuit; wherein an output of an eleventh of the plurality of noise predictive filters corresponds to a transition from the five state to a ten state of the detector circuit; wherein an output of a twelfth of the plurality of noise predictive filters corresponds to a transition from the five state to an eleven state of the detector circuit; wherein an output of a thirteenth of the plurality of noise predictive filters corresponds to a transition from the six state to a twelve state of the detector circuit; wherein an output of a fourteenth of the plurality of noise predictive filters corresponds to a transition from the six state to a thirteen state of the detector circuit; herein an output of a fifteenth of the plurality of noise predictive filters corresponds to a transition from the seven state to a fourteen state of the detector circuit; wherein an output of a sixteenth of the plurality of noise predictive filters corresponds to a transition from the seven state to a fifteen state of the detector circuit; wherein an output of a seventeenth of the plurality of noise predictive filters corresponds to a transition from the eight state to the zero state of the detector circuit; wherein an output of a eighteenth of the plurality of noise predictive filters corresponds to a transition from the eight state to the one state of the detector circuit; wherein an output of an nineteenth of the plurality of noise predictive filters corresponds to a transition from the nine state to the two state of the detector circuit; wherein an output of a twentieth of the plurality of noise predictive filters corresponds to a transition from the nine state to the three state of the detector circuit; wherein an output of a twenty-first of the plurality of noise predictive filters corresponds to a transition from the ten state to the four state of the detector circuit; wherein an output of a twenty-second of the plurality of noise predictive filters corresponds to a transition from the ten state to the five state of the detector circuit; wherein an output of a twenty-third of the plurality of noise predictive filters corresponds to a transition from the eleven state to the six state of the detector circuit; wherein an output of a twenty-fourth of the plurality of noise predictive filters corresponds to a transition from the eleven state to the seven state of the detector circuit; wherein an output of a twenty-fifth of the plurality of noise predictive filters corresponds to a transition from the twelve state to the eight state of the detector circuit; wherein an output of a twenty-sixth of the plurality of noise predictive filters corresponds to a transition from the twelve state to the nine state of the detector circuit; wherein an output of a twenty-seventh of the plurality of noise predictive filters corresponds to a transition from the thirteen state to the ten state of the detector circuit; wherein an output of a twenty-eighth of the plurality of noise predictive filters corresponds to a transition from the thirteen state to the eleven state of the detector circuit; wherein an output of a twenty-ninth of the plurality of noise predictive filters corresponds to a transition from the fourteen state to the twelve state of the detector circuit; wherein an output of a thirtieth of the plurality of noise predictive filters corresponds to a transition from the fourteen state to the thirteen state of the detector circuit; wherein an output of a thirty-first of the plurality of noise predictive filters corresponds to a transition from the fifteen state to the fourteen state of the detector circuit; and wherein an output of a thirty-second of the plurality of noise predictive filters corresponds to a transition from the fifteen state to the fifteen state of the detector circuit.

22. The circuit of claim 20, wherein the circuit further comprises:
an equalizing circuit operable to equalize a data input to a three value ($g_2$, $g_1$, $g_0$) target and to provide an equalized output.

23. The circuit of claim 22, wherein N is equal to four, wherein the number of the plurality of taps of each of the plurality of noise predictive filters is equal to four.

24. The circuit of claim 23, wherein a first of the plurality of taps uses the first subset of the series of detected bits ($a_{-2}$, $a_{-1}$, $a_0$) to calculate a noise value in accordance with the following equation:

$$a_{-2}g_2 + a_{-1}g_1 + a_0 g_0,$$

where $a_0$ is the most recent bit provided as an output of the N state detector circuit, $a_{-1}$ is the second most recent bit provided as an output of the N state detector circuit, and $a_{-2}$ is the third most recent bit provided as an output of the N state detector circuit;
wherein a second of the plurality of taps uses the second subset of detected bits ($a_{-4}$, $a_{-3}$) to calculate a noise value in accordance with the following equation:

$$a_{-4}g_1 + a_{-3}g_0,$$

where $a_{-3}$ is the fourth most recent bit provided as an output of the N state detector circuit, and $a_{-4}$ is the fifth most recent bit provided as an output of the N state detector circuit;
wherein a third of the plurality of taps uses a third subset of the series of detected bits ($a_{-3}$, $a_{-2}$, $a_{-1}$) to calculate a noise value in accordance with the following equation:

$$a_{-3}g_2 + a_{-2}g_1 + a_{-1}g_0;$$ and wherein a fourth of the plurality of taps uses a fourth subset of the series of detected bits ($a_{-4}$, $a_{-3}$, $a_{-2}$) to calculate a noise value in accordance with the following equation:

$$a_{-4}g_2 + a_{-3}g_1 + a_{-2}g_0.$$

25. The circuit of claim 20, wherein each of the plurality of noise predictive
filters is a noise predictive finite impulse response filter.

26. The circuit of claim 17, wherein the circuit further comprises:
a noise predictive filtering circuit, wherein the noise predictive filter is one of a plurality of noise predictive filters included in the noise predictive filtering circuit.

27. The circuit of claim 26, wherein each of the plurality of noise predictive filters provides an output corresponding to a respective state transition of the N state detector circuit.

28. The circuit of claim 26, wherein the number of the plurality of noise predictive filters is equal to $2^{N+1}$.

29. The circuit of claim 17, wherein the circuit is implemented as part of a device selected from a group consisting of: a storage device and a communication device.

30. The circuit of claim 17, wherein the circuit is implemented as part of an electronic device, wherein the electronic device is selected from a group consisting of: a hard disk drive and a wireless transmission device.

* * * * *